(12) United States Patent
Kohler et al.

(10) Patent No.: US 10,089,071 B2
(45) Date of Patent: Oct. 2, 2018

(54) AUTOMATIC AUDIO ATTENUATION ON IMMERSIVE DISPLAY DEVICES

(71) Applicant: Microsoft Technology Licensing, LLC, Redmond, WA (US)

(72) Inventors: Jeffrey Kohler, Redmond, WA (US); Denise Ng, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 55 days.

(21) Appl. No.: 15/172,080

(22) Filed: Jun. 2, 2016

(65) Prior Publication Data

US 2017/0351485 A1   Dec. 7, 2017

(51) Int. Cl.

| G06F 3/16 | (2006.01) |
|---|---|
| G06F 3/01 | (2006.01) |
| H03G 3/20 | (2006.01) |
| G02B 27/01 | (2006.01) |
| G10L 21/034 | (2013.01) |
| A63F 13/25 | (2014.01) |
| A63F 13/211 | (2014.01) |
| A63F 13/5255 | (2014.01) |
| A63F 13/212 | (2014.01) |

(Continued)

(52) U.S. Cl.
CPC ............ *G06F 3/167* (2013.01); *A63F 13/211* (2014.09); *A63F 13/212* (2014.09); *A63F 13/215* (2014.09); *A63F 13/25* (2014.09); *A63F 13/424* (2014.09); *A63F 13/5255* (2014.09); *G02B 27/017* (2013.01); *G06F 3/011* (2013.01); *G06F 3/165* (2013.01); *G10L 21/034* (2013.01); *H03G 3/20* (2013.01); *A63F 2300/8082* (2013.01); *G10L 15/26* (2013.01); *G10L 25/78* (2013.01)

(58) Field of Classification Search
None
See application file for complete search history.

(56) References Cited

U.S. PATENT DOCUMENTS

| 7,903,825 B1 | 3/2011 | Melanson |
|---|---|---|
| 8,687,021 B2 | 4/2014 | Bathiche et al. |

(Continued)

FOREIGN PATENT DOCUMENTS

CN   102893236 A   1/2013

OTHER PUBLICATIONS

"International Search Report and Written Opinion Issued in PCT Application No. PCT/US2017/034100", dated Aug. 7, 2017, 12 Pages.

(Continued)

*Primary Examiner* — Christopher Kohlman
(74) *Attorney, Agent, or Firm* — Alleman Hall Creasman & Tuttle LLP

(57) ABSTRACT

Examples disclosed herein relate to controlling volume on an immersive display device. One example provides a near-eye display device comprising a sensor subsystem, a logic subsystem, and a storage subsystem storing instructions executable by the logic subsystem to receive image sensor data from the sensor subsystem, present content comprising a visual component and an auditory component, while presenting the content, detect via the image sensor data that speech is likely being directed at a wearer of the near-eye display device, and in response to detecting that speech is likely being directed at the wearer, attenuate an aspect of the auditory component.

20 Claims, 6 Drawing Sheets

(51) Int. Cl.
*A63F 13/215* (2014.01)
*A63F 13/424* (2014.01)
*G10L 15/26* (2006.01)
*G10L 25/78* (2013.01)

(56) References Cited

U.S. PATENT DOCUMENTS

| | | | |
|---|---|---|---|
| 8,831,255 | B2 | 9/2014 | Crawford et al. |
| 9,213,405 | B2 | 12/2015 | Perez et al. |
| 9,245,387 | B2 | 1/2016 | Poulos et al. |
| 2007/0189544 | A1 | 8/2007 | Rosenberg |
| 2008/0089530 | A1 | 4/2008 | Bostick et al. |
| 2010/0079356 | A1 | 4/2010 | Hoellwarth |
| 2011/0096939 | A1* | 4/2011 | Ichimura ............ H04R 1/1083 381/74 |
| 2012/0235886 | A1* | 9/2012 | Border ............... G02B 27/0093 345/8 |
| 2014/0028712 | A1 | 1/2014 | Keating et al. |
| 2014/0108501 | A1 | 4/2014 | Papakipos et al. |
| 2014/0132628 | A1 | 5/2014 | Hoff, III |
| 2014/0198129 | A1 | 7/2014 | Liu et al. |
| 2014/0225918 | A1 | 8/2014 | Mittal et al. |
| 2015/0154804 | A1 | 6/2015 | Wang |
| 2015/0280670 | A1* | 10/2015 | Kauffmann ............ G10L 25/78 381/107 |
| 2015/0302867 | A1* | 10/2015 | Tomlin .................. G10L 25/78 704/270 |
| 2015/0302869 | A1 | 10/2015 | Tomlin et al. |
| 2016/0027209 | A1 | 1/2016 | Demirli et al. |

OTHER PUBLICATIONS

Robarts, Stu, "AAR Headphone Tech gives users Control over External Sound Filtering", Published on: Jan. 7, 2016 Available at: http://www.gizmag.com/harman-audio-augmented-reality-headphones/41224/.

Ranjan, et al., "Natural Listening over Headphones in Augmented Reality Using Adaptive Filtering Techniques", In Proceedings of IEEE/ACM Transactions on Audio, Speech, and Language Processing, vol. 23, Issue 11, Nov. 2015, pp. 1998-2002.

* cited by examiner

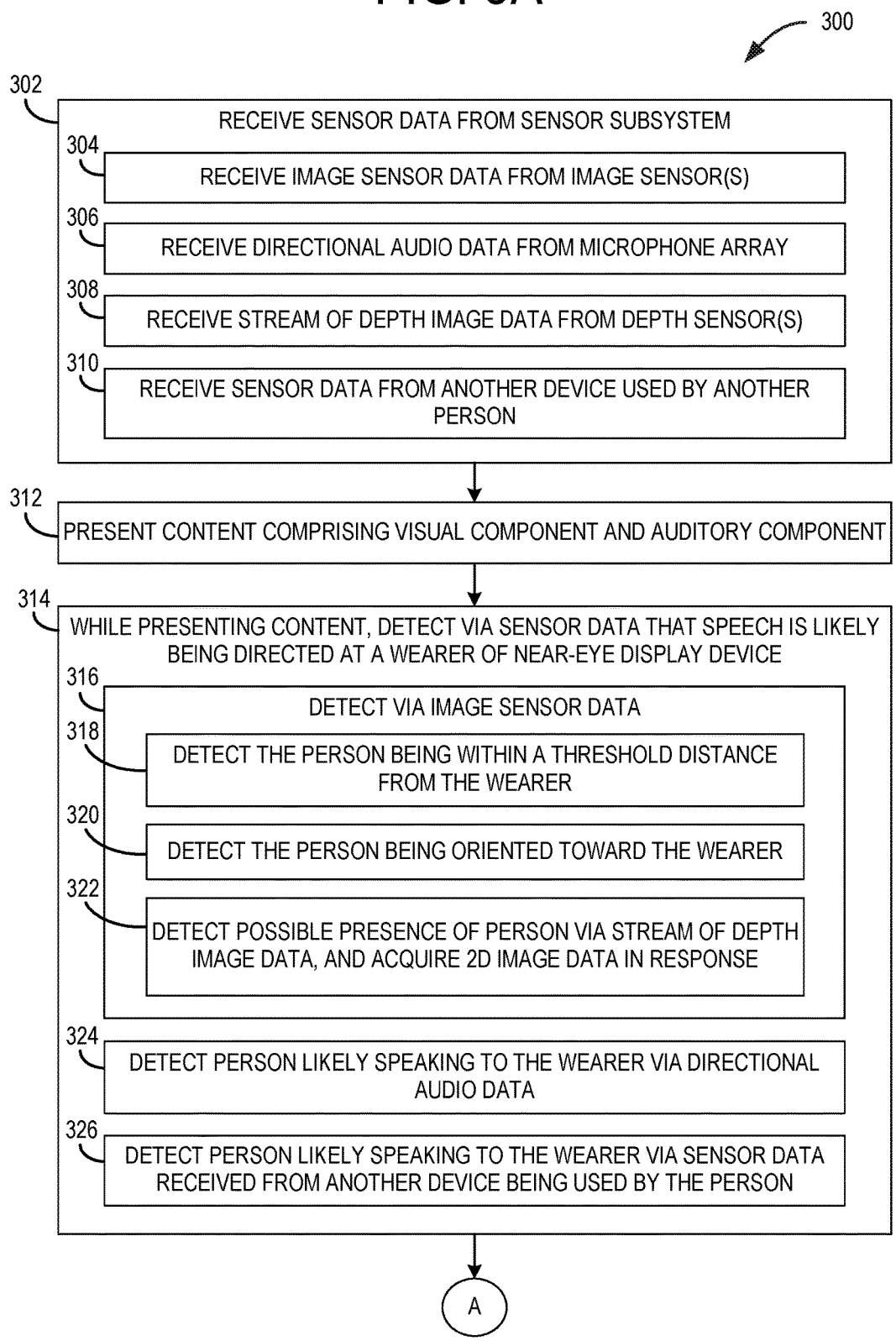

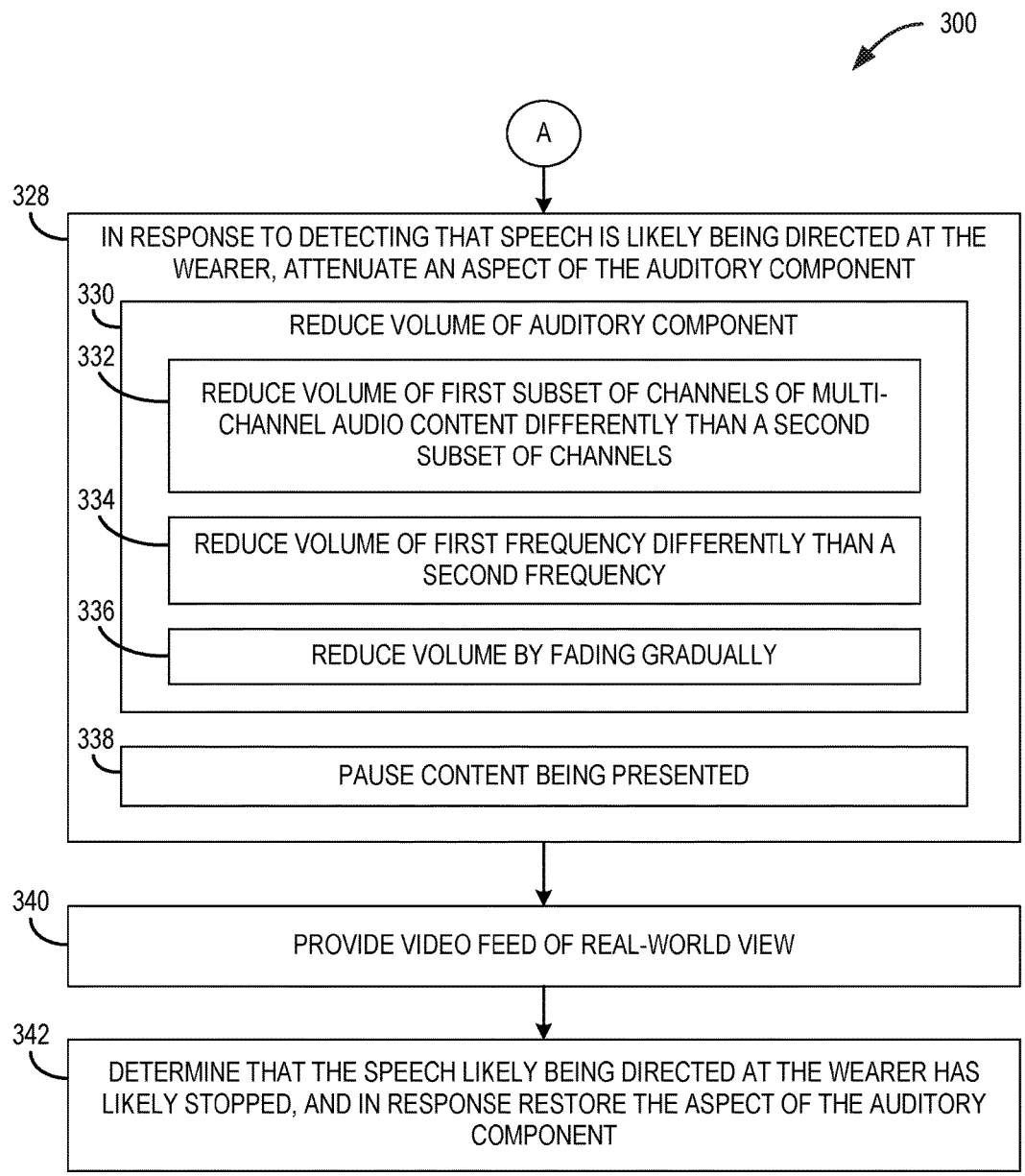

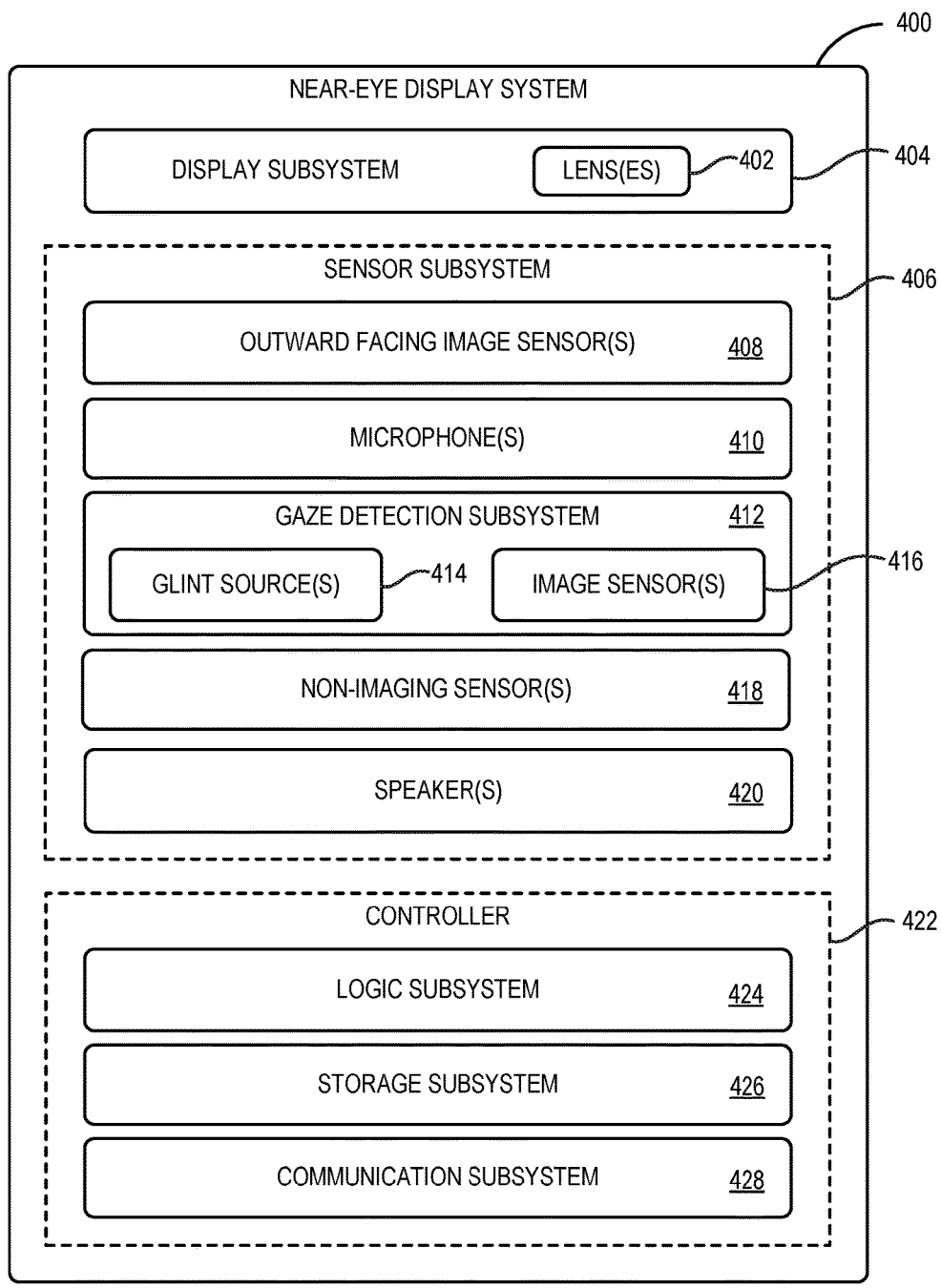

AUTOMATIC AUDIO ATTENUATION ON IMMERSIVE DISPLAY DEVICES

BACKGROUND

Display devices, such as near-eye display devices, may be configured to present virtual imagery and other content to a user along with accompanying audio information to provide an immersive virtual or augmented reality experience.

SUMMARY

Examples are disclosed that relate to automatically attenuating volume on an immersive display device. One example provides a near-eye display device comprising a sensor subsystem, a logic subsystem, and a storage subsystem storing instructions executable by the logic subsystem to receive image sensor data from the sensor subsystem, present content comprising a visual component and an auditory component, while presenting the content, detect via the image sensor data that speech is likely being directed at a wearer of the near-eye display device, and in response to detecting that speech is likely being directed at the wearer, attenuate an aspect of the auditory component.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 3A and 3B show an example method of automatically attenuating a volume of audio content presented via a near-eye display device.

FIG. 4 shows a block diagram of an example near-eye display system.

DETAILED DESCRIPTION

Figure 1:
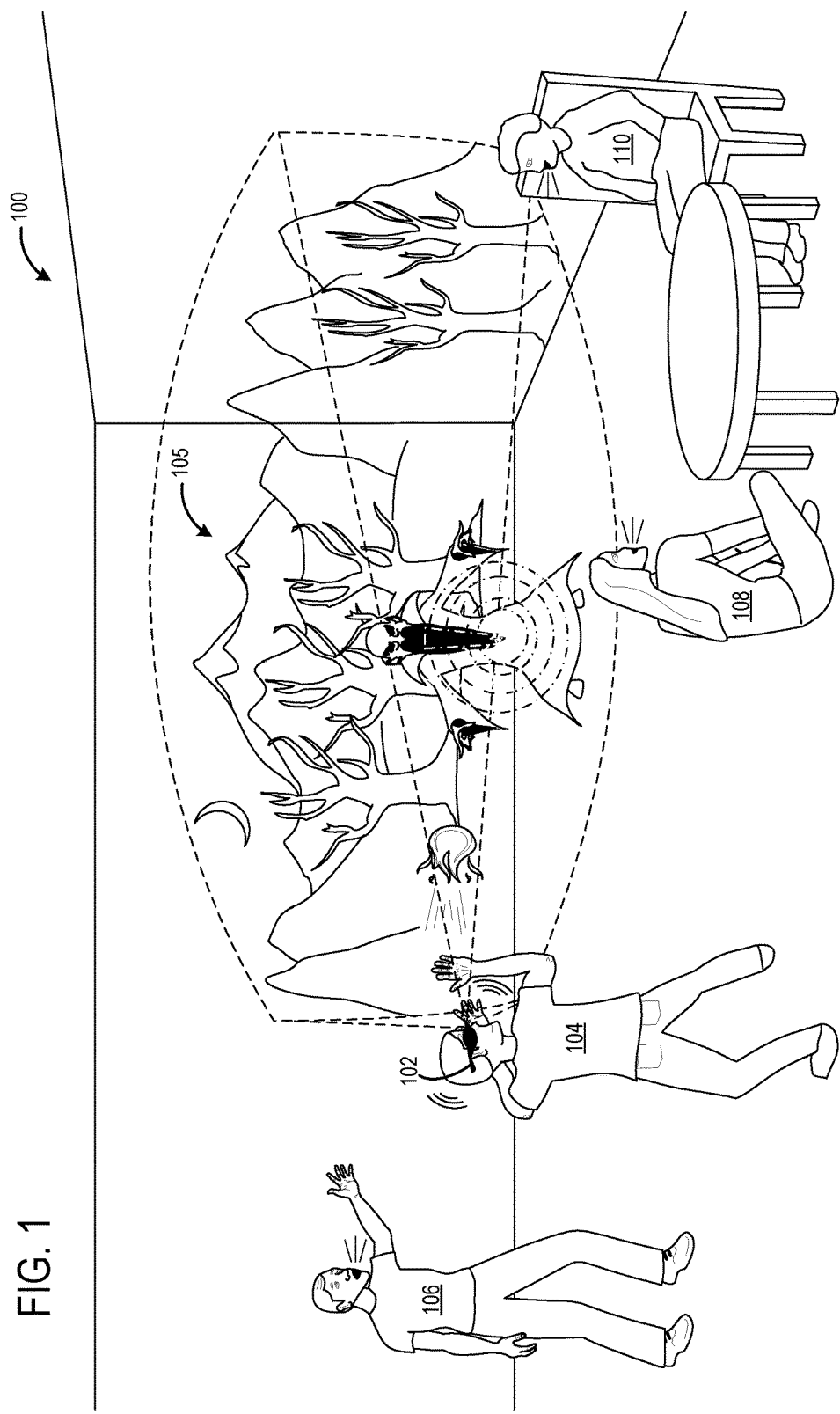
FIG. 1 shows an example use scenario for an example near-eye display device.

As mentioned above, near-eye display devices, such as head-mounted virtual reality or augmented reality display devices, may present users with immersive audio/visual experiences. Such experiences may be used for media presentation, gaming, work/productivity, and for many other computing interactions. FIG. 1 shows an example use scenario 100 in which an example near-eye display device 102 is worn by a user 104 playing an immersive mixed reality game. As illustrated, user 104 views virtual content 105 mixed with a view of a real-world background via a see-through display system.

In such immersive settings, at times user 104 may not notice when other people, such as person 106, are trying to interact with user 104. One approach to address this issue may be to detect ambient sounds via a microphone on the near-eye display device, and automatically reduce the volume of audio content in response to detected ambient sounds. However, such a method may result in the attenuation of audio presentations at inappropriate times. For example, in FIG. 1, voices detected from a conversation between person 108 and person 110 are not directed to user 104, but may nevertheless result in the reduction of a volume of audio content when detected by device 102. Thus, where ambient audio detection is relied upon without regard to the source of the detected ambient audio, near-eye display device 102 may not distinguish detected speech actually being directed at user 104 from speech not directed at user 104, and may subsequently reduce a volume of audio content being presented when it may not be appropriate or desired.

Accordingly, examples are disclosed that relate to determining via image sensor data whether speech from another person is likely directed to a user of a wearable display device, and attenuating an aspect of an audio presentation on a near-eye display device when such a determination is made. For example, sensor data may be used to determine whether a person is proximate to the user, whether a person is facing the user, whether detected speech originates from a same direction as a detected person, and/or whether words in the speech indicate that the speech is directed at the user. Then, the presence or absence of such factors may be used to help determine whether to attenuate an audio component of an immersive near-eye experience. This may help to reduce an occurrence of unwanted or unnecessary interruptions in the presentation of the immersive experience.

Image sensor data may be used in various ways to determine whether a person is likely directing speech to a user of a near-eye display device. For example, image sensor data may be used to determine a position (e.g. location and/or orientation) of one or more other persons relative to the user, as this information may be indicative of whether the person is speaking to the user. As a more specific example, near-eye display device 102 may utilize depth image data to detect that person 106 is within a threshold distance of user 104, e.g. via skeletal fitting and/or other machine learning techniques based on deep neural networks, semantic role labeling, and/or other suitable algorithms. Then, upon detecting that person 106 is within the threshold distance, the near-eye display device may acquire two-dimensional image data and apply facial detection algorithms to determine that person 106 is directly facing user 104. Examples of suitable facial detection algorithms may include, but are not limited, to Principal Component Analysis using the eigenfaces approach, Linear Discriminate Analysis, Elastic Bunch Graph Matching using the Fisherface algorithm, the Hidden Markov model, Multilinear Subspace Learning, and dynamic link matching. Determining that a person is facing the user may be indicative of a higher likelihood that the person is speaking to the user, while determining that a person is not facing the user may be indicative of a lower likelihood that the person is speaking to the user and may instead be speaking to someone else.

Further, near-eye display device 102 may apply gesture recognition algorithms to depth data to identify movements of person 106 (e.g. mouth movements, arm movements, hand/finger movements, etc.) indicative of possible attempted interaction with user 104. Examples of suitable gesture recognition algorithms include, but are not limited to, 3D model-based algorithms, skeletal-based algorithms, and appearance-based models. Using this information, near-eye display device 102 then may determine that person 106 is likely speaking to user 104, and in response attenuate audio content being presented on near-eye display device 102 such that user 104 is made aware to pay attention to person 106. These specific examples are not intended to be limiting, as image data may be used in other manners to detect a likelihood that a person is directed speech to a near-eye display user. For example, either two-dimensional image data or depth image data alone may be used for the determination.

Any suitable image sensor or combination of image sensors may be used. Examples include, but are not limited to, depth image sensors (e.g. time-of-flight, structured light camera(s), and/or stereo camera arrangements) and two-dimensional image sensors (e.g. RGB and/or grayscale sensors). Such image sensor(s) may be configured to acquire images in visible, infrared and/or other suitable wavelength range(s).

In some examples, image data may be used in combination with audio data to determine that a person is likely directing speech to a near-eye display device user. For example, a near-eye display device first may detect a person speaking via one or more microphones configured to detect ambient sounds. Upon detecting the person speaking, the near-eye display device then may acquire and analyze image data to determine whether the speech may be originating from a person standing near and/or facing the viewer.

Such audio data may be used to provide additional information. For example, where a near-eye display device comprises a directional microphone array (e.g. the device comprises multiple microphones located at different positions on the near-eye display device), a direction from which the speech is received may be determined, and the direction may be compared to the location of a person detected in image data to determine if the detected speech likely originated from the person. Further, in some examples, voice recognition may be applied in combination with facial identification (e.g. by matching voice and/or facial data to voice and/or facial information stored in user profiles at a remote service) to determine if the identity of the speaker matches the identity of a detected face. Additionally, speech recognition may be applied to identify words that may provide an indication that the person speaking is likely to be directing the speech to the near-eye display user. For example, identification of a name of the user in the identified spoken words may indicate that the speech is likely being directed at user 104.

As mentioned above, two-dimensional image data may be selectively acquired in response to certain triggers, rather than continuously acquired by near-eye display device 102. As one example, near-eye display device 102 may be configured to begin acquisition of two-dimensional image data in response to speech/voice information detected from ambient microphone inputs. As another example, near-eye display device 102 may initially acquire a stream of depth image data from on-board depth image sensor(s) to detect a possible presence of a person and then acquire two-dimensional image data to further determine whether the person is likely talking to user 104. Selectively activating acquisition of two-dimensional image data and/or facial detection in response to such triggers may help to reduce heat dissipation and power consumption of near-eye display device 102 compared to a system that continuously acquires two-dimensional image data.

Further, in some examples, a near-eye display device may be configured to attenuate sound upon detecting speech originating from a speaker system, such as an emergency speaker system in a building. Such speech may be identified, for example, by directional audio data combined with image data capturing an image of speaker.

Figure 2:
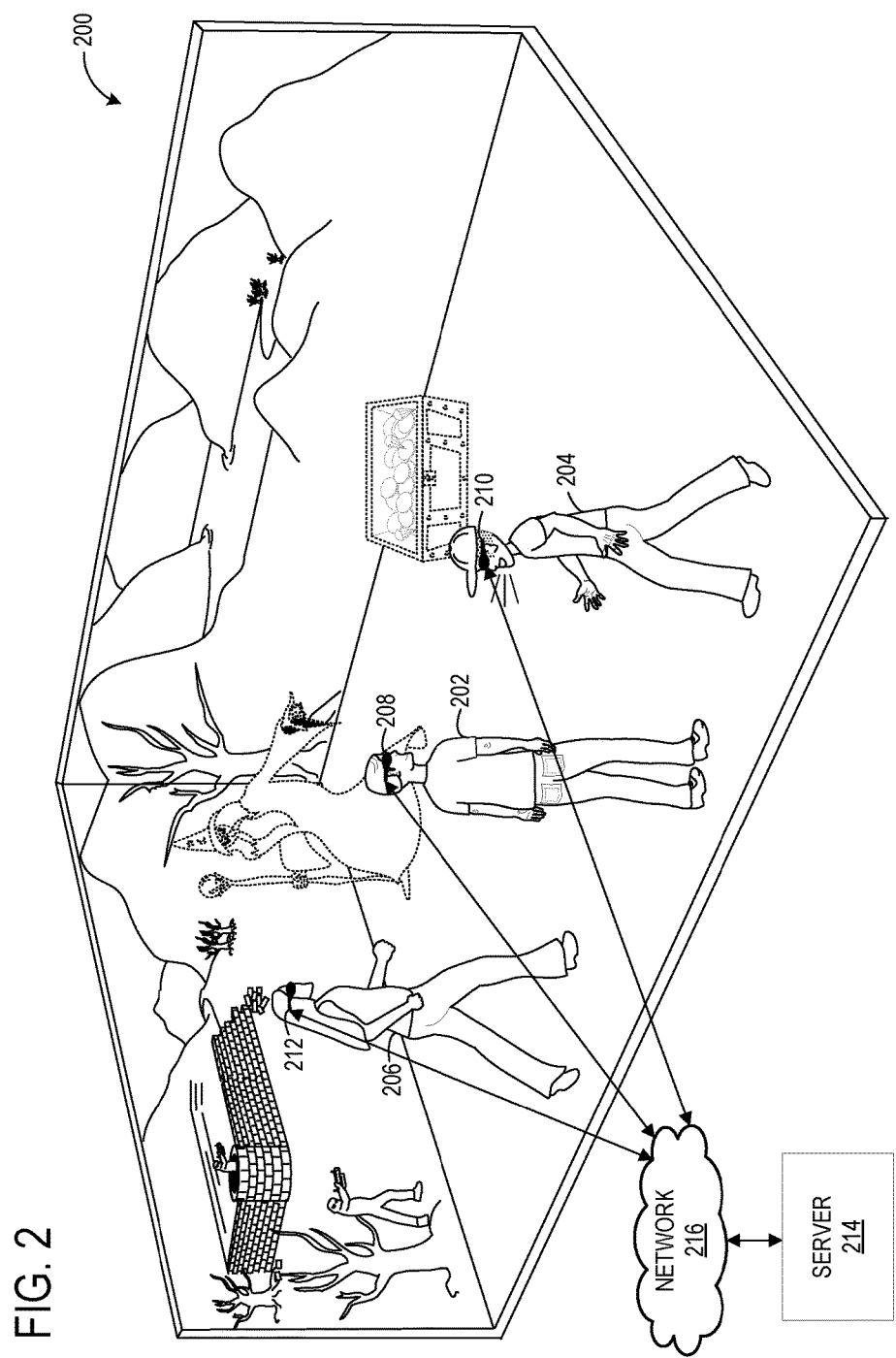
FIG. 2 shows an example use scenario for multiple near-eye display devices.

In yet other examples, a near-eye display device may be able to detect that speech is likely being directed to the wearer based on data received from other devices being used by other people. As one non-limiting example, FIG. 2 shows a multi-user scenario 200 in which users 202, 204, and 206 respectively wearing near-eye display devices 208, 210, and 212 are taking part in a shared, immersive augmented and/or virtual reality experience. Each of near-eye display devices 208, 210, and 212 includes one or more position sensors configured to acquire sensor data relating to a position of the device. Examples of such position sensors include, but are not limited to, accelerometers, gyroscopic sensors, and global positioning system (GPS) sensors. In some examples, devices may directly communicate position sensor data to other devices (e.g. via Bluetooth or other suitable protocol) to allow the location and orientation of each near-eye display device relative to other near-eye display devices to be determined. Further, the devices may send position sensor data to a server 214 in communication with each near-eye display device via a network 216, such that server 214 may distribute or otherwise provide the position sensor data from each device to other devices. In either example, a near-eye display device may utilize position sensor data received from other near-eye display devices to determine that a person wearing one of the other devices is likely directing speech to a user of the device. For example, near-eye display device 208 worn by user 202 may receive sensor data from near-eye display device 210 worn by user 204 (either directly or via an intermediate device such as server 214), who is attempting to speak to user 202. In response, near-eye display device 208 may determine that the location and orientation of near-eye display device 210 relative to that of near-eye display device 208 indicates that user 204 is within a threshold distance of and/or facing user 202. This information then may be used, either alone or in combination with other sensor data (e.g. audio data indicating whether user 204 is currently speaking) to determine whether user 204 is likely speaking to user 202.

In response to determining that user 204 is likely speaking to user 202, near-eye display device 208 may attenuate an aspect of audio content being presented on near-eye display device 208. A near-eye display device may attenuate any suitable aspect of an auditory component of content being presented by the device. As an example, a near-eye display device may be configured to reduce a volume of the auditory component globally across frequencies to a predefined reduced volume, or to a volume that is a suitably lower than a volume of detected speech and/or ambient sounds.

As another example, where the auditory component includes multi-channel audio content, the near-eye display device may selectively attenuate the volume of one or more selected sound channels while maintaining the volume of other channels, or decreasing volume of other sound channels in a different way. For example, the near-eye display device may attenuate the auditory component by reducing volume of or turning off background music being presented while maintaining current volume levels of other virtual sounds. As another example, the near-eye display device may attenuate volume at a first frequency or frequency range differently than at a second frequency or frequency range. In any of the above examples, the near-eye display device further may attenuate audio in other ways than volume reduction, such as via noise cancellation. To reduce the impact of the attenuation on a user experience, a near-eye display device may be configured to reduce a volume by fading the volume gradually, as opposed to abruptly cutting the volume. Further, in some examples, a near-eye display device may stop presentation of the audio content completely, instead of continuing audio playback during attenuation. Additionally, where a near-eye display device is presenting a virtual reality experience, the device may be configured to pause the experience and provide a video feed of a real-world view as acquired via an outward-facing image sensor, such that a wearer of the device may view the person that is likely speaking.

FIGS. 3A and 3B show a flow diagram depicting an example method 300 for presenting content on a near-eye display device. Method 300 includes, at 302, receiving sensor data from a sensor subsystem of the near-eye display device. As described above, receiving sensor data may include receiving image sensor data from one or more image sensor(s) at 304, receiving directional audio data from a microphone array at 306, receiving a stream of depth image data from one or more depth sensor(s) at 308, and/or receiving sensor data from another device used by another person at 310, as examples.

Method 300 further includes, at 312, presenting content comprising a visual component and an auditory component, and includes, at 314, while presenting the content, detecting via the sensor data that speech is likely being directed at a wearer of the near-eye display device. In some examples, this detection may be performed via image sensor data, as indicated at 316, and may utilize various methods of image data analysis. For example, the near-eye display device may use depth image data to detect that the person is within a threshold distance from the wearer at 318 and/or oriented toward the wearer at 320, and/or to detect gestures possibly indicative of a likelihood that the person is directing speech to the wearer. As another example, the near-eye display device may use two-dimensional image data to detect that the person is directly facing the wearer, such as by applying facial detection algorithms, which may indicate a likelihood that the person is speaking to the wearer.

Further, as mentioned above, a near-eye display device may be configured to first detect a possible presence of a person via data from a first sensor before acquiring two-dimensional image data for analyses such as facial recognition. This may help to conserve power and reduce thermal output of a near-eye display device. As such, detecting that speech is likely being directed at the wearer may further include, at 322, detecting a possible presence of a person via the stream of depth image data as received from depth sensor(s), and then in response acquiring two-dimensional image data with an outward-facing two-dimensional camera for the analyses of processes 318-320.

Detecting that speech is likely being directed at the wearer further may include, at 324, detecting via directional audio data that a person is likely speaking to the wearer, e.g. that detected speech is coining in a direction toward the wearer. In some examples, voice and/or speech recognition techniques may be used to a person speaking the voice and to detect certain words of interest (such as the user's name) that may be indicative of speech likely being directed to the wearer. The detection may also include, at 326, detecting that a person is likely speaking to the wearer via sensor data received from another device being used by the person. Sensor data from external devices may be utilized, for example, in scenarios where multiple display devices are being used by a plurality of users, such as in multi-user immersive experiences as described above with regard to FIG. 2. It will be understood that the near-eye display device may employ any one or more of the processes described above, and/or may use any other suitable sensor data.

Continuing with FIG. 3B, method 300 includes, at 328, attenuating an aspect of the auditory component of content being presented on the near-eye display device in response to detecting that speech is likely being directed at the wearer. Attenuating audio may include, for example, reducing a volume of the auditory component, as indicated at 330. Reducing a volume of the auditory component may include reducing the volume globally, reducing the volume of a first subset of channels of multi-channel audio content differently than a second subset of channels of the multi-channel audio content, as indicated at 332, reducing a volume of a first frequency differently than a second frequency of sound, as indicated at 334, or reducing the volume in any other suitable manner. In some examples, the volume may be reduced by fading gradually, as indicated at 336. Further, the volume may be reduced to a predefined level, to a volume that is suitably lower than a volume of detected speech, or may be completely attenuated. As yet another example, the near-eye display device may be configured to pause content being presented, at 338.

In some examples, logic may be applied to received sensor data to determine in what manner to attenuate an aspect of the auditory component. For example, audio may be initially reduced in volume when the near-eye display device detects that a person is likely speaking to the wearer, and may then be completely paused when detecting that the wearer is speaking in response.

Additionally, where the near-eye display device is presenting a virtual reality experience to the wearer such that the real world background world is not visible to the user, method 300 may further include, at 340, providing a video feed of a real-world view in addition to attenuating an aspect of the auditory component. This may help the wearer to better direct his/her attention to the person speaking.

Method 300 then includes, at 342, determining that the speech likely being directed at the wearer has likely stopped, and in response, restoring the attenuated aspect of the auditory component. For example, a global volume or channel-specific volume may be increased to a level being used before attenuation, volumes of various frequencies may be adjusted to pre-attenuation levels, paused playback may resume, and or any other restorative action may be performed. In some examples, the near-eye display device may wait for a predefined amount of time after the speech is determined to have stopped before restoring the aspect of the auditory component. This may provide a buffer period in which the auditory component remains attenuated to account for pauses in speech conversation.

FIG. 4 shows a block diagram of an example near-eye display system 400. The near-eye display devices 202, 204, and 206 each represents an example implementation of near-eye display system 400. Display system 400 includes one or more lenses 402 that form a part of a display subsystem 404, such that images may be displayed via lenses 402 (e.g. via projection onto lenses 402, waveguide system(s) incorporated into lenses 402, and/or in any other suitable manner). Display subsystem 404 may include a backlight and a microdisplay, such as liquid-crystal display (LCD) or liquid crystal on silicon (LCOS) display, in combination with one or more light-emitting diodes (LEDs), laser diodes, and/or other light sources. In other examples, the display subsystem 404 may utilize quantum-dot display technologies, active-matrix organic LED (OLED) technology, and/or any other suitable display technologies.

Display system 400 further includes a sensor subsystem 406, which includes one or more outward-facing image sensors 408 configured to acquire images of a real-world environment, such as to detect the presence of people other than a wearer of display system 400, and one or more microphones 410 configured to detect sounds, such as speech likely being directed at the wearer. Outward-facing image sensors 408 may include one or more depth sensor(s) and/or one or more two-dimensional image sensor(s) (e.g. RGB image sensors). Near-eye display system 400 may display completely virtual scenes via display subsystem 404, may display video-based augmented reality images via a viewfinder mode using data from an outward-facing image sensor, or may display augmented reality images via a see-through display subsystem.

Sensor subsystem 406 may further include a gaze detection subsystem 412 configured to detect a gaze direction of a user as user input for computing device actions. Gaze detection subsystem 412 may be configured to determine gaze directions of each of a user's eyes in any suitable manner. For example, in the depicted embodiment, gaze detection subsystem 412 comprises one or more glint sources 414, such as infrared light sources configured to cause a glint of light to reflect from each eyeball of a user, and one or more image sensor(s) 416, such as inward-facing sensors, configured to capture an image of each eyeball of the user. Changes in the glints from the user's eyeballs and/or a location of a user's pupil as determined from image data gathered via the image sensor(s) 416 may be used to determine a direction of gaze. Gaze detection subsystem 412 may have any suitable number and arrangement of light sources and image sensors. In other examples, gaze detection subsystem 412 may be omitted.

Display system 400 also may include additional sensors, as mentioned above. For example, display system 400 may include non-imaging sensor(s) 418, examples of which may include but are not limited to an accelerometer, a gyroscopic sensor, a global positioning system (GPS) sensor, and an inertial measurement unit (IMU). Such sensor(s) may help to determine the position, location, and/or orientation of the display device within the environment, which may be used to help determine the positions, locations, and/or orientations of other display devices being used by other people relative to display system 400, e.g. to help detect when a person is likely speaking to the wearer of the display system 400.

Motion sensors, as well as microphone(s) 410 and gaze detection subsystem 412, also may be employed as user input devices, such that a user may interact with the display system 400 via gestures of the eye, neck and/or head, as well as via verbal commands. It will be understood that sensors illustrated in FIG. 4 are shown for the purpose of example and are not intended to be limiting in any manner, as any other suitable sensors and/or combination of sensors may be utilized.

Display system 400 further includes one or more speaker(s) 420, for example, to provide audio outputs to a user for user interactions. Display system 400 further includes a controller 422 having a logic subsystem 424 and a storage subsystem 426 in communication with the sensors, gaze detection subsystem 412, display subsystem 404, and/or other components. Storage subsystem 426 comprises instructions stored thereon that are executable by logic subsystem 424, for example, to perform various tasks related to attenuating an auditory component of presented content as disclosed herein. Logic subsystem 424 includes one or more physical devices configured to execute instructions. Communication subsystem 428 may be configured to communicatively couple the display system 400 with one or more other computing devices. Logic subsystem 424, storage subsystem 426, and communication subsystem 428 are described in more detail below in regard to FIG. 5.

Near-eye display system 400 is described for the purpose of example, and thus is not meant to be limiting. It is to be understood that near-eye display system 400 may include additional and/or alternative sensors, cameras, microphones, input devices, output devices, etc. than those shown without departing from the scope of this disclosure. Near-eye display system 400 may be implemented as a virtual reality display system or an augmented reality system. Additionally, the physical configuration of a display device and its various sensors and subcomponents may take a variety of different forms without departing from the scope of this disclosure. Further, it will be understood that the methods and processes described herein may be implemented as a computer-application program or service, an application-programming interface (API), a library, and/or other computer program product. Such computer program products may be executable locally on near-eye display system 400 or other suitable display system, or may be executable remotely on a computing system in communication with near-eye display system 400.

Figure 5:
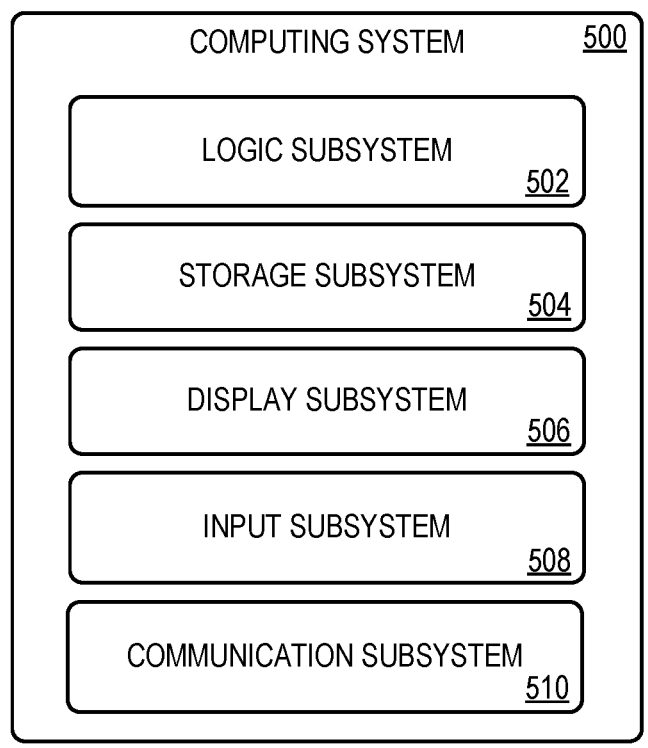
FIG. 5 shows a block diagram of an example computing system.

FIG. 5 schematically shows a non-limiting example of a computing system 500 that can enact one or more of the methods and processes described above. The computing system 500 is shown in simplified form. The computing system 500 may take the form of one or more personal computers, server computers, tablet computers, home-entertainment computers, network computing devices, gaming devices, mobile computing devices, mobile communication devices (e.g., smart phone), and/or other computing devices, including but not limited to the wearable devices and/or server devices described above.

The computing system 500 includes a logic subsystem 502 and a storage subsystem 504. The computing system 500 may optionally include a display subsystem 506, input subsystem 508, communication subsystem 510, and/or other components not shown in FIG. 5.

Logic subsystem 502 includes one or more physical devices configured to execute instructions. For example, logic subsystem 502 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Logic subsystem 502 may include one or more processors configured to execute software instructions. Additionally or alternatively, logic subsystem 502 may include one or more hardware or firmware logic subsystems configured to execute hardware or firmware instructions. Processors of logic subsystem 502 may be single-core or multi-core, and the instructions executed thereon may be configured for sequential, parallel, and/or distributed processing. Individual components of logic subsystem 502 optionally may be distributed among two or more separate devices, which may be remotely located and/or configured for coordinated processing. Aspects of logic subsystem 502 may be virtualized and executed by remotely accessible, networked computing devices configured in a cloud-computing configuration.

Storage subsystem 504 includes one or more physical devices configured to hold instructions executable by the logic subsystem 502 to implement the methods and processes described herein. When such methods and processes are implemented, the state of storage subsystem 504 may be transformed—e.g., to hold different data.

Storage subsystem 504 may include removable and/or built-in devices. Storage subsystem 504 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 504 may include volatile, nonvolatile, dynamic, static, read/write, read-only, random-access, sequential-access, location-addressable, file-addressable, and/or content-addressable devices.

It will be appreciated that storage subsystem 504 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 502 and storage subsystem 504 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 506 may be used to present a visual representation of data held by storage subsystem 504. This visual representation may take the form of virtual objects and images presented for an immersive virtual or augmented reality experience. As the herein described methods and processes change the data held by the storage subsystem, and thus transform the state of the storage subsystem, the state of display subsystem 506 may likewise be transformed to visually represent changes in the underlying data. Display subsystem 506 may include one or more display devices utilizing virtually any type of technology. Such display devices may be combined with logic subsystem 502 and/or storage subsystem 504 in a shared enclosure, or such display devices may be peripheral display devices.

When included, input subsystem 508 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

Communication subsystem 510 may be configured to communicatively couple computing system 500 with one or more oilier computing devices. Communication subsystem 510 may include wired and/or wireless communication devices compatible with one or more different communication protocols. As non-limiting examples, communication subsystem 510 may be configured for communication via a wireless telephone network, or a wired or wireless local- or wide-area network. In some embodiments, communication subsystem 510 may allow computing system 500 to send and/or receive messages to and/or from other devices via a network such as the Internet.

Another example provides a near-eye display device comprising a sensor subsystem comprising one or more image sensors, a logic subsystem, and a storage subsystem storing instructions executable by the logic subsystem to receive image sensor data from the sensor subsystem, present content comprising a visual component and an auditory component, while presenting the content, detect via the image sensor data that speech is likely being directed at a wearer of the near-eye display device, and in response to detecting that speech is likely being directed at the wearer, attenuate an aspect of the auditory component. The instructions may be additionally or alternatively executable to detect that speech is likely being directed at the wearer by detecting via the image sensor data that a person is likely speaking to the wearer based on detecting a face of the person. The sensor subsystem may additionally or alternatively comprise a microphone array, and the instructions may be additionally or alternatively executable to detect that speech is likely being directed at the wearer by detecting that a person is likely speaking to the wearer via directional audio data as received from the microphone array. The instructions may be additionally or alternatively executable to detect that speech is likely being directed at the wearer by detecting that a person is likely speaking to the wearer via sensor data received from another device being used by the person. The instructions may be additionally or alternatively executable to detect that speech is likely being directed at the wearer by detecting that a person is likely speaking to the wearer by detecting one or more of the person being within a threshold distance from the wearer and the person being oriented toward the wearer. The instructions may be additionally or alternatively executable to attenuate an aspect of the auditory component by reducing a volume of the auditory component. The auditory component may additionally or alternatively comprise multi-channel audio content, and the instructions may be additionally or alternatively executable to attenuate an aspect of the auditory component by reducing a volume of a first subset of channels of the multi-channel audio content differently than a second subset of channels of the multi-channel audio content. The instructions may be additionally or alternatively executable to attenuate an aspect of the auditory component by pausing the content being presented. The instructions may be additionally or alternatively executable to determine that the speech likely being directed at the wearer has likely stopped, and in response restore the aspect of the auditory component. The instructions executable to receive sensor data may additionally or alternatively comprise instructions executable to receive a stream of depth image data from one or more depth image sensors, and the instructions may be additionally or alternatively executable to detect a possible presence of a person via the stream of depth image data, and in response acquire two-dimensional image data with an outward-facing two-dimensional camera, and detect that the person is likely speaking to the wearer via the two-dimensional image data. The near-eye display device may additionally or alternatively comprise a virtual reality display device, and the instructions may be additionally or alternatively executable to, upon detecting that speech is likely being directed at the wearer, provide a video feed of a real-world view.

Another example provides, on a head-mounted near-eye display device comprising a sensor subsystem and one or more image sensors, a method comprising receiving image sensor data from the sensor subsystem, presenting content on the near-eye display device, the content comprising a visual component and an auditory component, while presenting the content on the near-eye display device, detecting via the image sensor data that speech is likely being directed at a wearer of the near-eye display device, and in response to detecting that speech is likely being directed at the wearer of the near-eye display device, attenuating an aspect of the auditory component. Detecting that speech is likely being directed at the wearer may additionally or alternatively comprise detecting that a person is likely speaking to the wearer via the image sensor data based on detecting a face of the person. Detecting that speech is likely being directed at the wearer may additionally or alternatively comprise detecting that a person is likely speaking to the wearer via directional audio data received from a microphone array of the sensor subsystem. Detecting that speech is likely being directed at the wearer may additionally or alternatively comprise detecting that a person is likely speaking to the wearer via sensor data received from another device being used by the person. Attenuating an aspect of the auditory component may additionally or alternatively comprise reducing a volume of the auditory component.

Yet another example provides a near-eye display device comprising a sensor subsystem comprising one or more image sensors, a logic subsystem, and a storage subsystem storing instructions executable by the logic subsystem to receive image sensor data from the sensor subsystem, present content, the content comprising a visual component and an auditory component, while presenting the content, detect via the image sensor data that speech is likely being directed at a wearer of the near-eye display device, and in response to detecting that speech is likely being directed at the wearer, reduce a volume of the auditory component. The auditory component may additionally or alternatively comprise multi-channel audio content, and the instructions executable to reduce a volume of the auditory component may additionally or alternatively comprise instructions executable to reduce a volume of a first subset of channels of the multi-channel audio content differently than a second subset of channels of the multi-channel audio content. The instructions may be additionally or alternatively executable to detect that speech is likely being directed at the wearer by detecting via the image sensor data that a person is likely speaking to the wearer based on detecting a face of the person. The instructions may be additionally or alternatively executable to detect that speech is likely being directed at the wearer by detecting that a person is likely speaking to the wearer by detecting one or more of the person being within a threshold distance from the wearer and the person being oriented toward the wearer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A near-eye display device, comprising:
    a sensor subsystem comprising one or more image sensors;
    a logic subsystem; and
    a storage subsystem storing instructions executable by the logic subsystem to
        receive image sensor data from the sensor subsystem,
        present content comprising a visual component and an auditory component,
        while presenting the content, detect speech from a first person,
        determine via the image sensor data that speech from the first person is likely being directed at a wearer of the near-eye display device,
        in response to determining that speech from the first person is likely being directed at the wearer, attenuate an aspect of the auditory component,
        while presenting the content, detect speech from a second person,
        determine via the image sensor data that speech from the second person is likely not being directed at the wearer of the near-eye display device, and
        in response to determining that speech from the second person is likely not being directed at the wearer, not attenuate the aspect of the auditory component.

2. The near-eye display device of claim 1 wherein the instructions executable to detect that speech is likely being directed at the wearer comprise instructions executable to detect via the image sensor data that a person is likely speaking to the wearer based on detecting a face of the person.

3. The near-eye display device of claim 1, wherein the sensor subsystem comprises a microphone array, and wherein the instructions executable to detect that speech is likely being directed at the wearer comprise instructions executable to detect that a person is likely speaking to the wearer via directional audio data as received from the microphone array.

4. The near-eye display device of claim 1, wherein the instructions executable to detect that speech is likely being directed at the wearer comprise instructions executable to detect that a person is likely speaking to the wearer via sensor data received from another device being used by the person.

5. The near-eye display device of claim 1, wherein the instructions executable to detect that speech is likely being directed at the wearer comprise instructions executable to detect that a person is likely speaking to the wearer by detecting one or more of the person being within a threshold distance from the wearer and the person being oriented toward the wearer.

6. The near-eye display device of claim 1, wherein the instructions executable to attenuate an aspect of the auditory component comprise instructions executable to reduce a volume of the auditory component.

7. The near-eye display device of claim 1, wherein the auditory component comprises multi-channel audio content, and wherein the instructions executable to attenuate an aspect of the auditory component comprise instructions executable to reduce a volume of a first subset of channels of the multi-channel audio content differently than a second subset of channels of the multi-channel audio content.

8. The near-eye display device of claim 1, wherein the instructions executable to attenuate an aspect of the auditory component comprise instructions executable to pause the content being presented.

9. The near-eye display device of claim 1, wherein the instructions are further executable to determine that the speech likely being directed at the wearer has likely stopped, and in response restore the aspect of the auditory component.

10. The near-eye display device of claim 1, wherein the instructions executable to receive sensor data comprise instructions executable to receive a stream of depth image data from one or more depth image sensors, and wherein the instructions are further executable to detect a possible presence of a person via the stream of depth image data, and in response acquire two-dimensional image data with an outward-facing two-dimensional camera, and detect that the person is likely speaking to the wearer via the two-dimensional image data.

11. The near-eye display device of claim 1, wherein the near-eye display device comprises a virtual reality display device, and wherein the instructions are further executable to, upon detecting that speech is likely being directed at the wearer, provide a video feed of a real-world view.

12. On a head-mounted near-eye display device comprising a sensor subsystem and one or more image sensors, a method comprising:
receiving image sensor data from the sensor subsystem;
presenting content on the near-eye display device, the content comprising a visual component and an auditory component;
while presenting the content on the near-eye display device, detecting speech from a first person;
determining via the image sensor data that speech from the first person is likely being directed at a wearer of the near-eye display device;
in response to determining that speech from the first person is likely being directed at the wearer of the near-eye display device, attenuating an aspect of the auditory component;
while presenting the content, detecting speech from a second person;
determining via the image sensor data that speech from the second person is likely not being directed at the wearer of the near-eye display device; and
in response to determining that the speech from the second person is likely not being directed at the wearer, not attenuating the aspect of the auditory component.

13. The method of claim 12, wherein detecting that speech is likely being directed at the wearer comprises detecting that a person is likely speaking to the wearer via the image sensor data based on detecting a face of the person.

14. The method of claim 12, wherein detecting that speech is likely being directed at the wearer comprises detecting that a person is likely speaking to the wearer via directional audio data received from a microphone array of the sensor subsystem.

15. The method of claim 12, wherein detecting that speech is likely being directed at the wearer comprises detecting that a person is likely speaking to the wearer via sensor data received from another device being used by the person.

16. The method of claim 12, wherein attenuating an aspect of the auditory component comprises reducing a volume of the auditory component.

17. A near-eye display device, comprising:
a sensor subsystem comprising one or more image sensors;
a logic subsystem; and
a storage subsystem storing instructions executable by the logic subsystem to
receive image sensor data from the sensor subsystem,
present content, the content comprising a visual component and an auditory component,
while presenting the content, detect speech from a first person,
determine via the image sensor data that speech from the first person is likely being directed at a wearer of the near-eye display device,
in response to determining that speech from the first person is likely being directed at the wearer, reduce a volume of the auditory component,
while presenting the content, detect speech from a second person,
determine via the image sensor data that speech from the second person is likely not being directed at the wearer of the near-eye display device, and
in response to determining that speech from the second person is likely not being directed at the wearer, not reduce the volume of the auditory component.

18. The near-eye display device of claim 17, wherein the auditory component comprises multi-channel audio content, and wherein the instructions executable to reduce a volume of the auditory component comprise instructions executable to reduce a volume of a first subset of channels of the multi-channel audio content differently than a second subset of channels of the multi-channel audio content.

19. The near-eye display device of claim 17, wherein the instructions executable to detect that speech is likely being directed at the wearer comprise instructions executable to detect via the image sensor data that a person is likely speaking to the wearer based on detecting a face of the person.

20. The near-eye display device of claim 17, wherein the instructions executable to detect that speech is likely being directed at the wearer comprise instructions executable to detect that a person is likely speaking to the wearer by detecting one or more of the person being within a threshold distance from the wearer and the person being oriented toward the wearer.

* * * * *